United States Patent
Jung et al.

(10) Patent No.: US 10,761,146 B2
(45) Date of Patent: Sep. 1, 2020

(54) WAFER PROBE CARD FOR EVALUATING MICRO LIGHT EMITTING DIODES, ANALYSIS APPARATUS INCLUDING THE SAME, AND METHOD OF FABRICATING THE WAFER PROBE CARD

(71) Applicant: SAMSUNG ELECTRONICS CO., LTD., Suwon-si (KR)

(72) Inventors: Jong Hoon Jung, Suwon-si (KR); Dae Sik Kim, Suwon-si (KR); Sung Yeol Kim, Suwon-si (KR); Seung Yong Shin, Bucheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 174 days.

(21) Appl. No.: 15/887,551

(22) Filed: Feb. 2, 2018

(65) Prior Publication Data

US 2018/0340985 A1 Nov. 29, 2018

Related U.S. Application Data

(60) Provisional application No. 62/512,105, filed on May 29, 2017.

(30) Foreign Application Priority Data

Aug. 16, 2017 (KR) .................. 10-2017-0103478

(51) Int. Cl.
*G01R 31/00* (2006.01)
*G01R 31/44* (2020.01)
*G01J 1/44* (2006.01)
*G01R 1/073* (2006.01)
(Continued)

(52) U.S. Cl.
CPC .............. *G01R 31/44* (2013.01); *G01J 1/42* (2013.01); *G01J 1/44* (2013.01); *G01J 3/505* (2013.01);
(Continued)

(58) Field of Classification Search
CPC .............. G01R 31/2635; G01R 1/0735; G01R 31/2884; G01R 31/44; G01R 1/06716;
(Continued)

(56) References Cited

U.S. PATENT DOCUMENTS 7,948,252 B2 * 5/2011 Grube ................ G01R 1/07342
324/754.07
8,476,918 B2 * 7/2013 Huang ............... G01R 31/2635
324/754.01
(Continued)

FOREIGN PATENT DOCUMENTS

CN 103884424 A 6/2014
EP 1837663 A1 9/2007
(Continued)

OTHER PUBLICATIONS

International Search Report (PCT/ISA/210) dated May 29, 2018 issued by the International Searching Authority in International Application No. PCT/KR2018/001595.
(Continued)

*Primary Examiner* — Vinh P Nguyen
(74) *Attorney, Agent, or Firm* — Sughrue Mion, PLLC

(57) ABSTRACT

Provided are a wafer probe card that matches in one-to-one correspondence with an LED wafer by implementing a probe system having the same size as the LED wafer, and inspects brightness and wavelength of light emitted from a plurality of LEDs provided on the LED wafer at once by controlling the plurality of LEDs to emit light, an analysis apparatus including the same, and a method of fabricating the wafer probe card.

13 Claims, 22 Drawing Sheets

(51) Int. Cl.
*G01R 31/26* (2020.01)
*G01J 3/50* (2006.01)
*G01J 1/42* (2006.01)

(52) U.S. Cl.
CPC ..... *G01R 1/07314* (2013.01); *G01R 31/2635* (2013.01); *G01J 2001/4252* (2013.01)

(58) Field of Classification Search
CPC ............ G01R 1/06727; G01R 1/07314; G01R 31/2889; G01R 31/311; G01R 3/00; G01J 2001/4252; G01J 1/0425; G01J 1/0451; G01J 1/42; G01J 2001/4247; G01J 3/505; G01J 3/0216; G01J 1/44; H01H 2221/002; H01H 35/26
See application file for complete search history.

(56) References Cited

U.S. PATENT DOCUMENTS

| | | | |
|---|---|---|---|
| 9,222,961 B1 | 12/2015 | Lin | |
| 2002/0182778 A1* | 12/2002 | Wang | .................. H01L 21/6835 438/119 |
| 2011/0101350 A1 | 5/2011 | Greisen | |
| 2012/0326060 A1* | 12/2012 | Kenane | .................. G01J 3/513 250/578.1 |
| 2013/0001405 A1 | 1/2013 | Walker | |

FOREIGN PATENT DOCUMENTS

| | | |
|---|---|---|
| EP | 2439517 A1 | 4/2012 |
| JP | 2012-198194 A | 10/2012 |
| KR | 10-2010-0057258 A | 5/2010 |
| KR | 10-2010-0071750 A | 6/2010 |
| KR | 10-1025566 A | 3/2011 |
| KR | 10-2012-0037352 A | 4/2012 |
| WO | 2009147718 A1 | 12/2009 |

OTHER PUBLICATIONS

Communication dated Apr. 1, 2020, from the European Patent Office in counterpart European Application No. 18809303.3.

* cited by examiner

WAFER PROBE CARD FOR EVALUATING MICRO LIGHT EMITTING DIODES, ANALYSIS APPARATUS INCLUDING THE SAME, AND METHOD OF FABRICATING THE WAFER PROBE CARD

CROSS-REFERENCE TO RELATED APPLICATIONS

This application claims the priority from U.S. Patent Application No. 62/512,105, filed on May 29, 2017 in the United States Patent and Trademark Office and Korean Patent Application No. 10-2017-0103478, filed on Aug. 16, 2017 in the Korean Intellectual Property Office, the disclosures of which are incorporated herein in its entirety by reference.

BACKGROUND

1. Field

Example embodiments of the present disclosure relate to a wafer probe card for evaluating micro light emitting diodes (LEDs), an analysis apparatus including the same, and a method of fabricating the wafer probe card.

2. Description of the Related Art

Light-emitting devices such as light-emitting diodes (LED) or vertical cavity surface emitting laser diode (VCSELs) are inspected to evaluate electrical and optical characteristics thereof after completing the manufacture thereof.

According to conventional inspection methods, a small electrified probe may be brought into direct contact with an LED provided on a wafer to supply a current to the LED such that the LED emits light. An analysis system may acquire electrical and optical properties of light emitted from each LED provided on the wafer in the form of Blue Tape data.

Based on the data obtained as described above, manufacturers of high-brightness LED devices separate the LEDs from the wafer and supply the LEDs in accordance with wavelength and brightness required in a manufacturing process.

According to the conventional inspection methods, since LED devices including sapphire provided on a wafer may be larger in size, the LED devices may be sufficiently inspected by using the probe. However, in recent LED display apparatuses in which LEDs are used as display pixels, each LED is becoming smaller to several tens of micrometers ($\mu m$) in size.

When used to inspect LED devices having a size of several tens of micrometers ($\mu m$), the conventional inspection methods using a probe are not efficient since an inspection time increases due to inefficient supply of currents and frequent breakage of the probe.

SUMMARY

One or more example embodiments of the present disclosure provide a wafer probe card that matches in one-to-one correspondence with an LED wafer by implementing a probe system having the same size as the LED wafer and inspects brightness and wavelength of a plurality of LEDs at once by controlling the plurality of LEDs to emit light, an analysis apparatus including the same, and a method of fabricating the wafer probe card.

According to an aspect of an example embodiment, there is provided a wafer probe card including a substrate, an insulating layer formed on the substrate, a plurality of first pads and a plurality of second pads formed on the insulating layer, and a plurality of rear pads connected to the plurality of first pads and the plurality of second pads, respectively, via through silicon vias (TSVs), wherein the plurality of first pads and the plurality of second pads are configured to transfer electrical signals to electrode pads of a light emitting diode (LED) wafer.

The plurality of first pads may be connected to each other by an electric wiring in a first direction through the TSVs, and the plurality of second pads may be connected to each other by an electric wiring in a second direction through the TSVs.

The substrate may be formed of silicon.

The wafer probe card may include holes for alignment with the LED wafer.

The plurality of first pads may be formed by deposition after etching the insulating layer.

An anisotropic conductive film (ACF) and a polyimide (PI) film may be formed on the plurality of rear pads.

According to an aspect of another example embodiment, there is provided an analysis apparatus including an optical source application unit configured to transmit power to a wafer probe card, an optical measurement unit configured to collect light emitted from a plurality of light emitting diodes (LEDs) and transmit measurement results of the light collected, and a processor configured to execute instructions to control the optical source application unit and analyze the plurality of LEDs based on the measurement results received from the optical measurement unit, wherein the wafer probe card includes a substrate, an insulating layer formed on the substrate, a plurality of first pads and a plurality of second pads formed on the insulating layer, and a plurality of rear pads connected to each of the plurality of first pads and the plurality of second pads, respectively, using through silicon vias (TSVs), wherein the plurality of first pads and the plurality of second pads are configured to transfer power from the optical source application unit to the plurality of LEDs.

The processor may be further configured to control the optical source application unit to alternately apply the power.

The plurality of first pads may be connected to each other by an electric wiring in a first direction through the TSVs, and the plurality of second pads may be connected to each other by an electric wiring in a second direction through the TSVs.

The processor may be further configured to selectively apply power through the electric wiring in the first direction and the electric wiring in the second direction.

The processor may be further configured to create map data on the plurality of LEDs based on the measurement results.

The analysis apparatus may further include a storage unit configured to store the created map data.

The analysis apparatus may further include a stage on which a wafer including the plurality of LEDs is placed, wherein the stage includes a glass window configured to transmit the light emitted from the plurality of LEDs.

The optical measurement unit may be further configured to collect light transmitted through the glass window.

According to an aspect of another example embodiment, there is provided a method of fabricating a wafer probe card, the method including preparing a substrate having an insulating layer formed to expose a plurality of first pads, forming a plurality of second pads on the insulating layer, and forming a plurality of rear pads formed on a surface opposite to a surface of the substrate provided with the insulating layer, wherein the plurality of rear pads are connected to the plurality of first pads and the plurality of second pads by through silicon vias (TSVs).

The method may further include leveling the plurality of first pads and the plurality of second pads.

The method may further include forming an anisotropic conductive film (ACF) to the plurality of rear pads.

The method may further include forming a polyimide (PI) film on the ACF.

The preparing of the substrate may include etching a photoresist and depositing the plurality of first pads after forming the insulating layer on the substrate.

The forming of the plurality of first pads may include etching the insulating layer provided with the plurality of first pads and re-depositing the plurality of first pads after depositing the plurality of second pads.

BRIEF DESCRIPTION OF THE DRAWINGS

The above and/or other aspects of the disclosure will become apparent and more readily appreciated from the following description of the example embodiments, taken in conjunction with the accompanying drawings of which.

DETAILED DESCRIPTION

Figure 1:
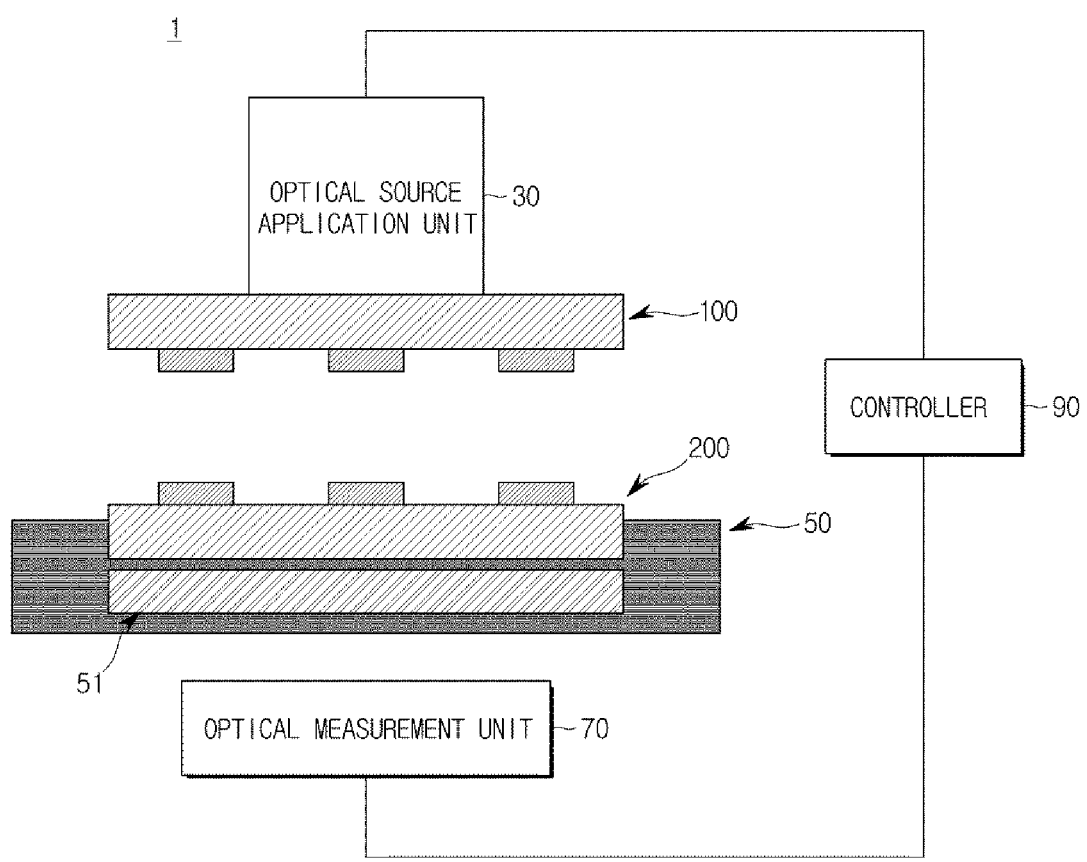
FIG. 1 is a schematic diagram illustrating an analysis apparatus including a wafer probe card according to an example embodiment.

Reference will now be made in detail to the example embodiments of the present disclosure, examples of which are illustrated in the accompanying drawings, wherein like reference numerals refer to like elements throughout. This specification does not describe all elements of the embodiments of the present disclosure and detailed descriptions on what are well known in the art or redundant descriptions on substantially the same configurations may be omitted. As used herein, the terms "unit," "module," "member," and "block" may be implemented using a software or hardware component. According to an example embodiment, a plurality of "units," "modules," "members," and "blocks" may also be implemented using one element, and one "unit," "module," "member," and "block" may include a plurality of elements.

Throughout the specification, when an element is referred to as being "connected to" another element, it may be directly or indirectly connected to the other element and the "indirectly connected to" includes connected to the other element via a wireless communication network.

Also, it is to be understood that the terms "comprise," "include," and "have" indicate the existence of elements disclosed in the specification, but does not preclude the possibility that one or more other elements may exist or may be added.

Throughout the specification, it will be understood that when one element, is referred to as being "on" another element, it can be directly on the other element, or intervening elements may also be present therebetween.

It will be understood that, although the terms "first", "second", etc., may be used herein to describe various elements, these elements should not be limited by these terms. The above terms are used only to distinguish one component from another.

An expression used in the singular encompasses the expression of the plural, unless it has a clearly different meaning in the context.

The reference numerals used in operations are used for descriptive convenience and are not intended to describe the order of operations and the operations may be performed in a different order unless otherwise stated.

FIG. 1 is a schematic diagram illustrating an analysis apparatus including a wafer probe card according to an example embodiment.

Referring to FIG. 1, an analysis apparatus 1 may include a wafer probe card 100, an optical source application unit 30 configured to apply a current or voltage to the wafer probe card 100, a light-emitting diode (LED) wafer 200 configured to emit light upon receiving the current or voltage from the wafer probe card 100, a glass window 51 configured to transmit light emitted from LEDs included in the LED wafer 200, an optical measurement unit 70 configured to measure wavelength or brightness of light emitted from the LEDs included in the LED wafer 200, and a controller 90 configured to create map data based on signals received from the optical measurement unit 70 and control the overall operation of the analysis apparatus 1.

Particularly, the wafer probe card 100 may be provided in the same size as the LED wafer 200 to correspond to the LED wafer 200 and may transfer a current or voltage to the LED wafer 200 through pads 110 and 130 as illustrated in FIG. 3.

The LED wafer 200 is a target object to be analyzed by the analysis apparatus 1 and placed on a stage 50 of the analysis apparatus 1.

The LED wafer 200 includes LEDs of a predetermined size which includes electrode pads 210 and 230 as illustrated in FIG. 3 which may be brought into contact with the pads 110 and 130 of the wafer probe card 100, respectively.

Figure 20:
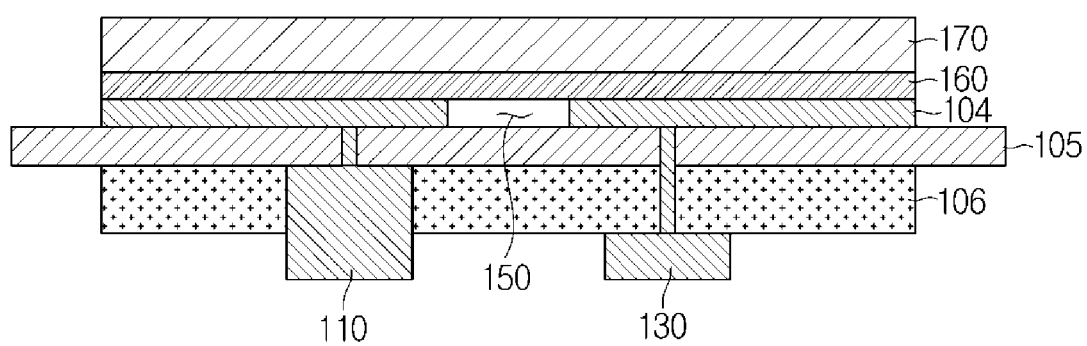

The optical source application unit 30 may transmit a voltage or current to the wafer probe card 100 in accordance with a control signal of the controller 90 and is connected specifically to a polyimide (PI) film 170 as illustrated in FIG. 20 included in the wafer probe card 100.

The optical measurement unit 70 may receive light emitted from the LEDs and transmit the measurement results to the controller 90. Specifically, the optical measurement unit 70 may measure an amount of the emitted light and collect a spectrum of light. The optical measurement unit 70 may convert the received light into an electrical signal by analyzing brightness or wavelength of the received light and may transmit the electrical signal to the controller 90.

The controller 90 may be a processor configured to control the overall operation of the analysis apparatus 1. Particularly, the controller 90 may control the optical source application unit 30, the optical measurement unit 70, and the stage 50, and output map data including evaluation results of the LEDs created by receiving the measurement results from the optical measurement unit 70.

The controller 90 may be implemented using a memory to store data on algorithms for controlling operations of the elements of the analysis apparatus 1 or programs for realizing the algorithms and a processor to perform the operations by using data stored in the memory. In this regard, the memory and the processor may be implemented using separate chips or integrated into a single chip.

The controller 90 may be connected to a storage unit configured to store the processed data. The storage unit may be implemented using at least one of a non-volatile memory such as read only memory (ROM), programmable ROM (PROM), erasable programmable ROM (EPROM), electrically erasable programmable ROM (EEPROM), and flash memory, a volatile memory such as random access memory (RAM), or a storage medium such as hard disk drive (HDD) and CD-ROM, without being limited thereto. The storage unit may be a memory implemented as a separate chip from the processor described above with reference to the controller 90 or a memory integrated with the processor as a single chip.

The analysis apparatus 1 may further include one or more elements in addition to the elements illustrated in FIG. 1, or at least one of the elements illustrated in FIG. 1 may be excluded therefrom.

For example, the analysis apparatus 1 may further include an interface configured to output data processed by the controller 90 and receive an input command of a user, and a communication module configured to transmit the processed data to an external device.

The interface may be connected to a display configured to display the map data created by the controller 90. The display may be implemented using a cathode ray tube (CRT), a digital light processing (DLP) panel, a plasma display penal (PDP), a liquid crystal display (LCD) panel, an electro luminescence (EL) panel, an electrophoretic display (EPD) panel, an electrochromic display (ECD) panel, a light emitting diode (LED) panel, or an organic light emitting diode (OLED) panel, without being limited thereto.

In addition, the interface may be connected to a hardware device such as a button, a switch, a pedal, a keyboard, a mouse, a track-ball, a lever, a handle, and a stick which receive input commands of the user and a software device such as a graphic user interface (GUI), for example, a touch pad which connects a touch signal of the user together with the display.

Figure 2:
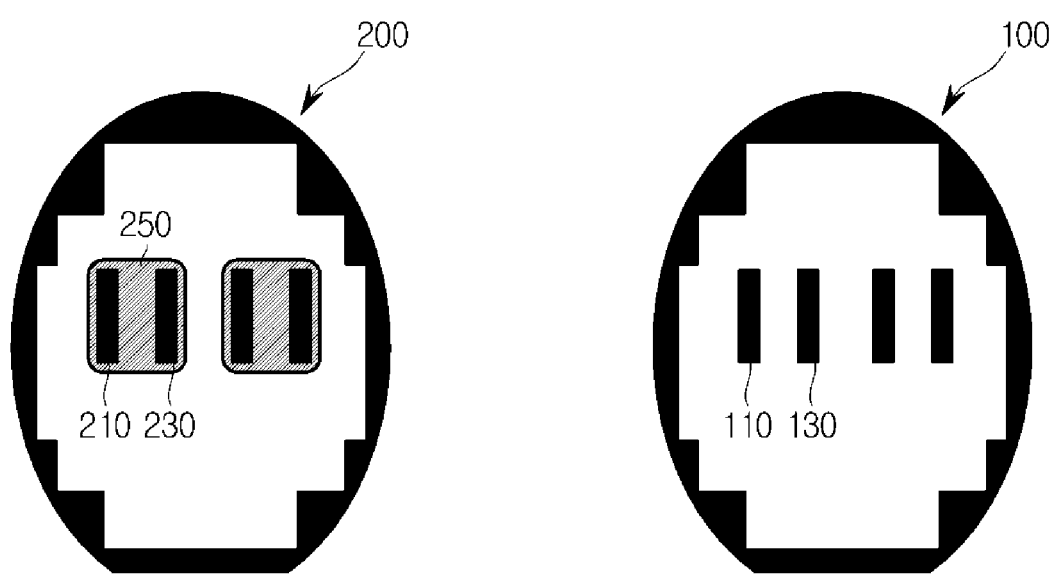
FIG. 2 is a view for comparing a wafer probe card and an LED wafer according to an example embodiment.

FIG. 2 is a view comparing a wafer probe card 100 and an LED wafer 200 according to an example embodiment.

Referring to FIG. 2, the LED wafer 200 may include one or more LEDs 250. Two electrode pads 210 and 230 corresponding to P and N types are provided on each LED 250. Hereinafter, the P type electrode pad is referred to as a first LED electrode pad 210 and the N type electrode pad is referred to as a second LED electrode pad 230.

The wafer probe card 100 according to an example embodiment includes a first pad 110 and a second pad 130 to transfer a current or voltage respectively to the first LED electrode pad 210 and the second LED electrode pad 230 in direct contact therewith.

In addition, the wafer probe card 100 may include the first pads 110 and the second pads 130 in the same number and same size as the first and second LED electrode pads 210 and 230 of the LEDs 250 provided on the LED wafer 200 to be inspected.

Thus, all of the LEDs 250 may be simultaneously inspected by applying a current or voltage to the LEDs 250 by using the wafer probe card 100. Therefore, efficiency of the inspection may be increased according to an example embodiment.

Figure 3A:
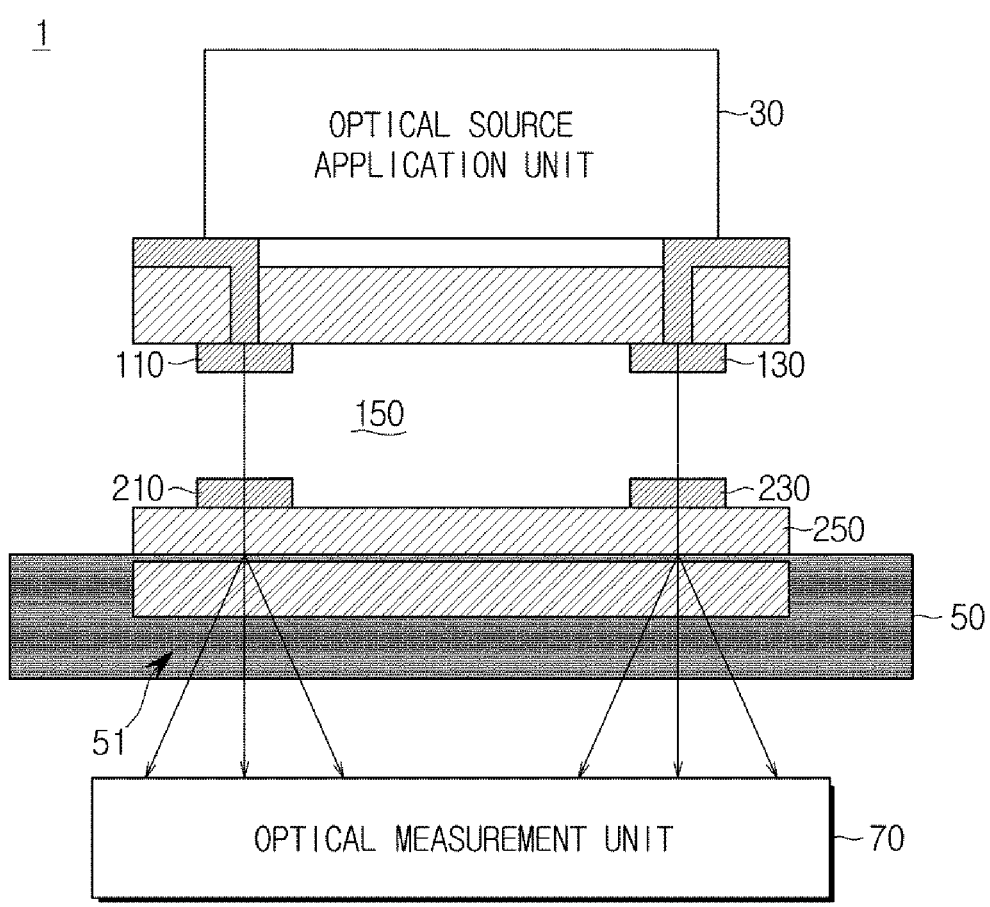
FIGS. 3A and 3B are examples describing the operation of analysis apparatuses including different wafer probe cards according to example embodiments.
Figure 3B:
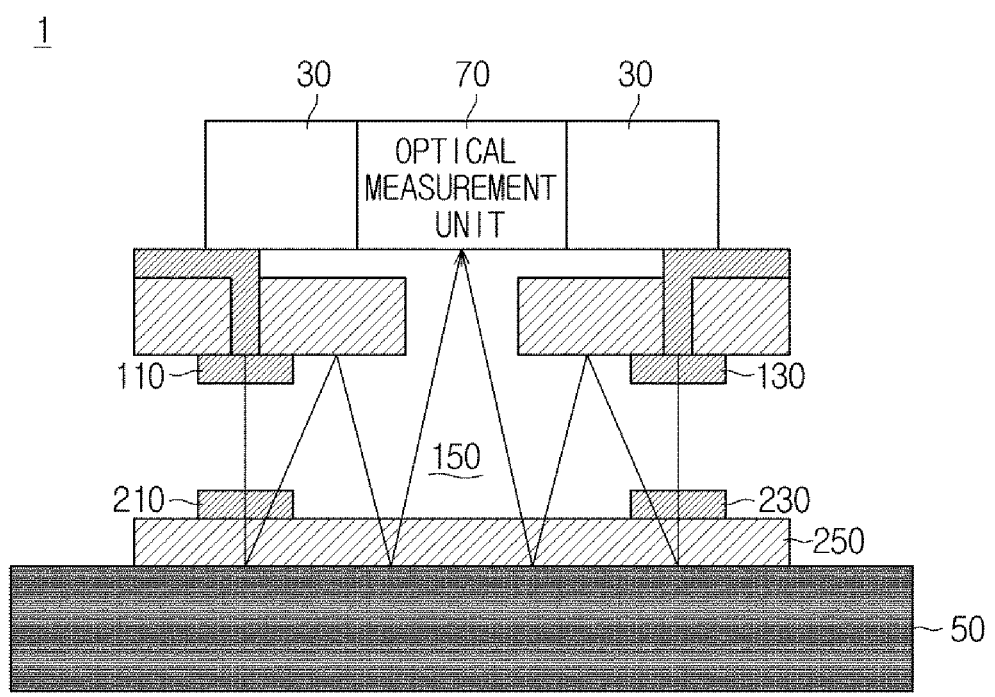

FIGS. 3A and 3B are views for describing the operation of analysis apparatuses including different wafer probe cards according to example embodiments.

Referring to FIG. 3A, the optical source application unit 30 may transmit a current or voltage required for inspection of the first pad 110 and the second pad 130 of the wafer probe card 100 based on the control of the controller 90.

The wafer probe card 100 may transfer the voltage or current to the first LED electrode pad 210 and the second LED electrode pad 230 provided on the LED wafer 200 through the first pad 110 and the second pad 130, respectively.

The LED 250 may emit light upon receiving power from each of the first and second electrode pads 210 and 230.

Light emitted from the LED 250 may be transferred to the optical measurement unit 70 through the glass window 51 provided in the stage 50 and the optical measurement unit 70 collects the emitted light and analyzes brightness or wavelength of the light emitted from the LED 250.

According to an example embodiment, as illustrated in FIG. 3B, an optical measurement unit 70 included in an analysis apparatus 1 may be disposed in the same direction as the optical source application unit 30 with respect to the wafer probe card 100.

Light may be emitted from the LED 250 not in a particular direction, and thus, the light emitted from the LED 250 may be reflected by the stage 50.

Also, the wafer probe card 100 may include a silicon substrate on which the first pad 110 and the second pad 130 are mounted. Thus, light emitted from the LED 250 may be reflected by the first pad 110 and the second pad 130. However, example embodiments are not limited thereto. For example, a wafer probe card 100 according to an example embodiment as illustrated in FIG. 3B may include through silicon vias (TSVs) 150 and may transmit light emitted from the LED 250 at predetermined intervals.

Thus, the optical measurement unit 70 provided in the analysis apparatus 1 may collect light passing through the wafer probe card 100 of FIG. 3B and transfer the light to the controller 90.

FIGS. 3A and 3B schematically illustrate examples of the present disclosure, but example embodiments are not limited thereto.

Figure 4A:
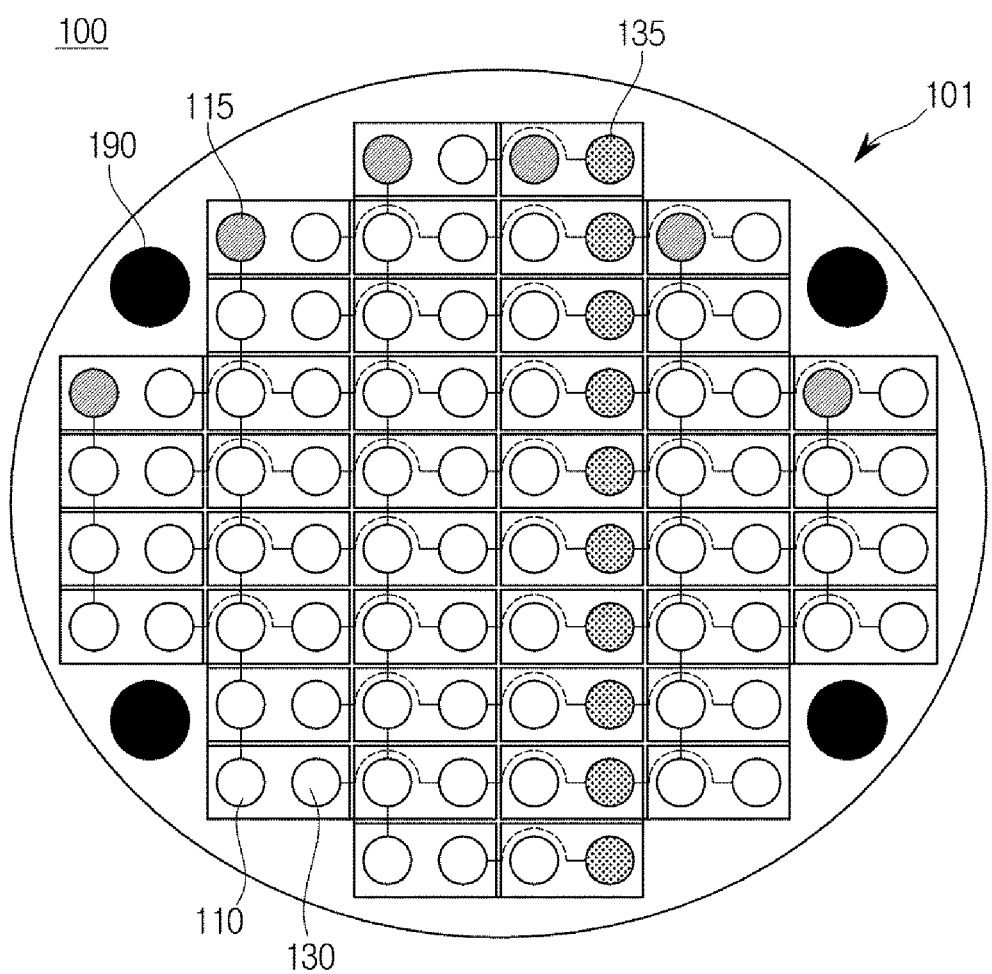
FIGS. 4A and 4B are top and bottom views of a wafer probe card according to an example embodiment.
Figure 4B:
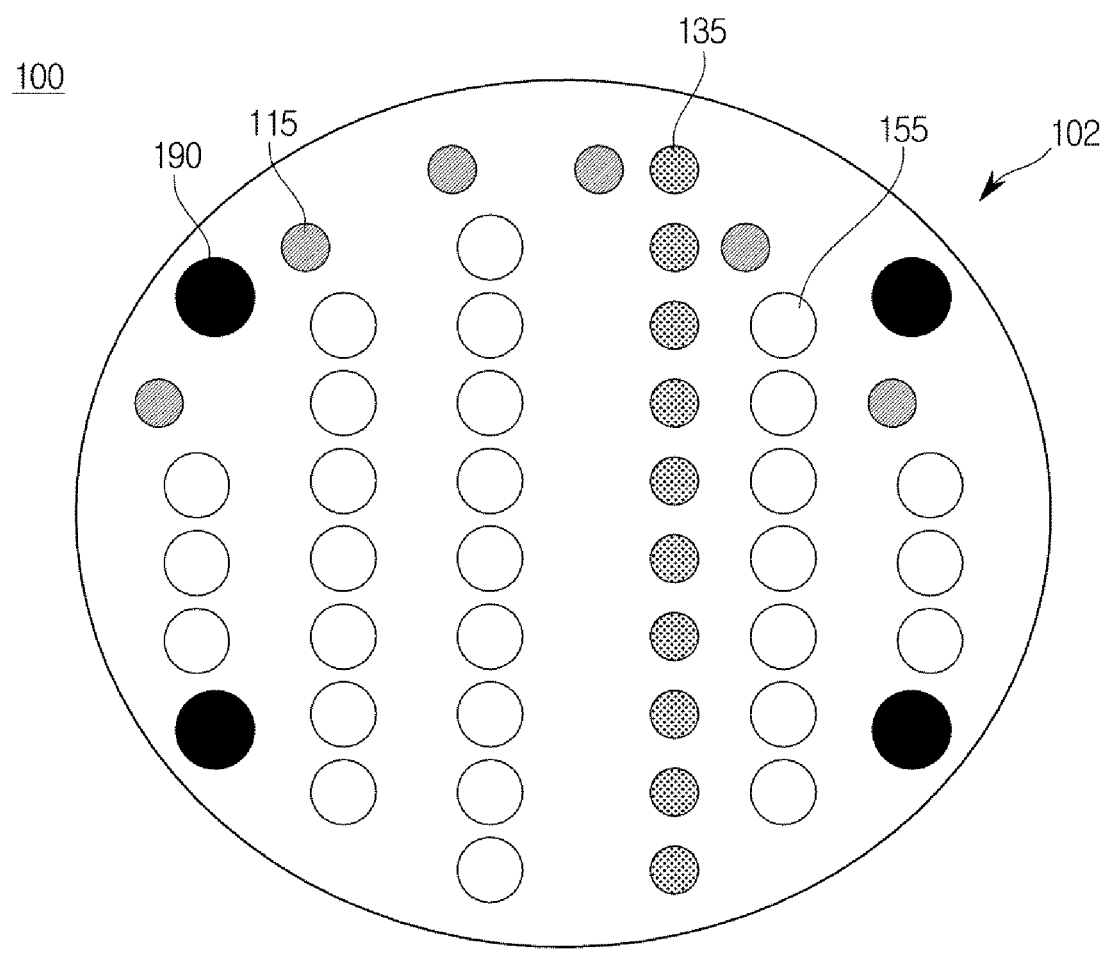

FIGS. 4A and 4B are top and bottom views of a wafer probe card 100 according to an example embodiment.

Specifically, FIG. 4A illustrates a bottom surface 101 of the wafer probe card 100 and FIG. 4B illustrates a top surface 102 of the wafer probe card 100.

As described above, the structure of the wafer probe card 100 may include the first pad 110 and the second pad 130 which are in one-to-one correspondence with the first LED electrode pad 210 and the second LED electrode pad 230 provided on the LED wafer 200 to be inspected. The first pad 110 and the second pad 130 may have the same size.

In addition, the wafer probe card 100 has align holes 190 for the purpose of alignment with the LEDs and the LED wafer 200. When the align holes 190 are formed in the bottom surface 101 and the top surface 102 of the wafer probe card 100, the align holes 190 are penetrated through the wafer probe card 100. The user may prevent the LED wafer 200 in contact with the wafer probe card 100 from being dislocated by using the align holes 190.

In the wafer probe card 100 illustrated in FIG. 4A, one first pad 110 may be connected with another first pad 110 in a longitudinal direction (first direction) in a line-by-line manner via an electric wire. Also, one second pad 130 may be connected to another second pad 130 in a lateral direction (second direction) via an electric wire.

In addition, in the wafer probe card 100, the electric wiring connecting the first pads 110 and the electric wiring connecting the second pads 130 are connected to TSV points 115 and 135 which are finally connected to an upper surface of the wafer probe card 100. The TSV points 115 and 135 are may be the through silicon vias (TSVs).

The TSV points 115 and 135 are pathways through which the first pad 110 and the second pad 130 are connected to the top surface and the bottom surface.

The TSV points 115 and 135 correspond to positive and negative poles of the power delivered by the optical source application unit 30. That is, the wafer probe card 100 may apply the current or voltage selectively to the first pads 110 and the second pads 130 of the wafer probe card 100 by controlling only the TSV points 115 and 135, and without connecting each of the first pads 110 and the second pads 130 with the positive and negative poles of the optical source application unit 30 in a one-to-one correspondence manner with each other.

For example, in order to apply a current or voltage to a first pad 110 and a second pad 130 indicated by reference numerals 110 and 130 illustrated in FIG. 4A, the current or voltage may be applied to a first TSV point 115 indicated by the reference numeral 115 in FIG. 4A and a second TSV point 135 in a second row from the last row and a column indicated by the reference numeral 135 of FIG. 4A According to this example configuration, materials and structures required for conventional analysis apparatuses such as a substrate, a mold, and gold may be omitted. Since the first and second pads 110 and 130 may allow all LEDs 250 provided on the LED wafer 200 to emit light simultaneously, it is possible to omit separation/realignment processes performed by the conventional analysis apparatuses and it is possible to shorten an analysis time since a device for moving the analysis apparatus 1 such as a chuck is not required.

In the top surface 102 of the wafer probe card 100 shown in FIG. 4B, holes 155 are formed as TSVs between the first pads 110 and the second pads 130. The holes 155 may be filled with a conductive metal on the top surface 102 of the wafer probe card 100.

Figure 5:
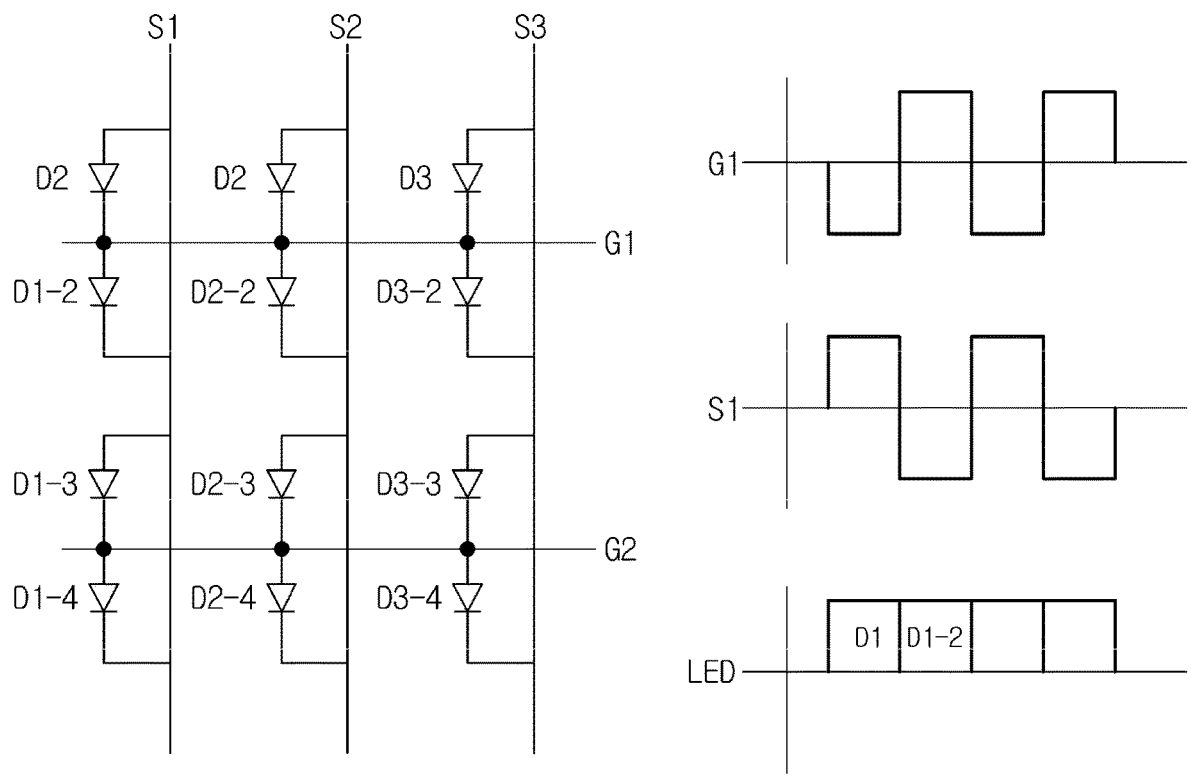
FIG. 5 is a view for describing an operating method of a wafer probe card 100 according to an example embodiment.

FIG. 5 is a view for describing an operating method of a wafer probe card 100 according to an example embodiment.

A wafer probe card 100 according to an example embodiment may alternately apply negative power and positive power to the first TSV point 115 and the second TSV point 135 in a manner different from the example embodiment described above with reference to FIGS. 4A and 4B.

When this structure is shown in a circuit diagram, diodes illustrated in FIG. 5 correspond to the first pads 110 and the second pads 130 respectively. In order to control an LED in contact with the first and second pads 110 and 130 corresponding to a diode D1 to emit light, a negative power is applied to a first gate G1 and a positive power is applied to a first source S1. In order to control an LED corresponding to a diode D1-2 to emit light, a positive power is applied to the first gate G1 and a negative power is applied to the first source S1.

That is, when the wafer probe card 100 is fabricated as illustrated the circuit diagram of FIG. 5, two LEDs may emit light by using one wiring by alternately applying positive and negative powers by the optical source application unit 30.

Figure 6:
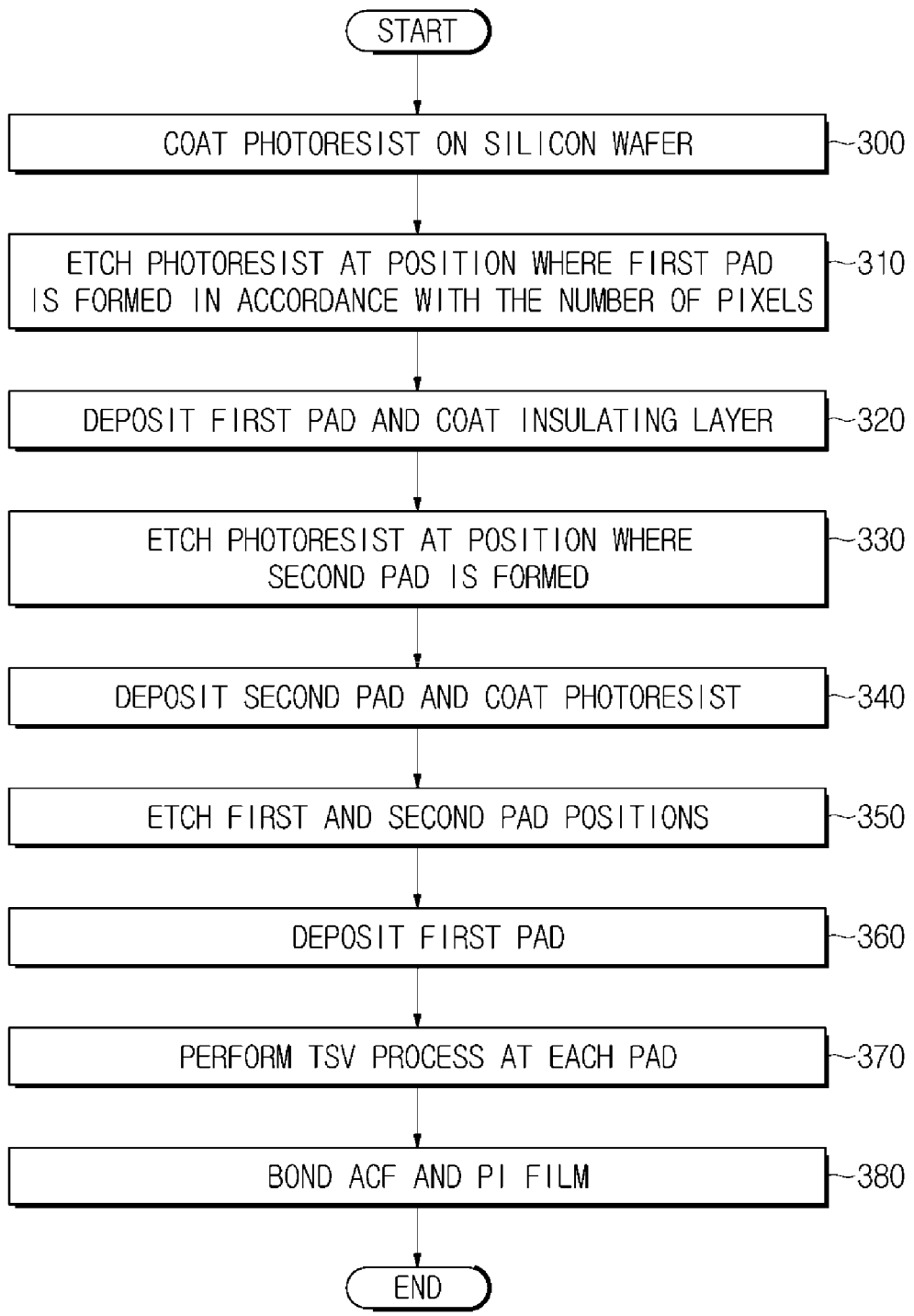
FIG. 6 is a flowchart for describing a method of fabricating a wafer probe card according to an example embodiment.

FIG. 6 is a flowchart for describing a method of fabricating a wafer probe card according to an example embodiment. In addition, FIGS. 7 to 20 are diagrams for describing the method of fabricating the wafer probe card.

Figure 7:
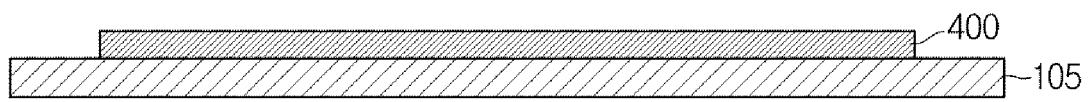
FIGS. 7 to 20 are diagrams for describing the method of fabricating the wafer probe card according to example embodiments.

A method of fabricating the wafer probe card 100 includes coating a photoresist 400 on a silicon wafer 105 as illustrated in FIG. 7 (300).

Next, the photoresist 400 is etched to correspond to a position of the first pad 110 in accordance with the number of pixels (310).

Specifically, a mask 500 corresponding to the position of the first pad 110 is used to form the first pad 110.

Figure 8:
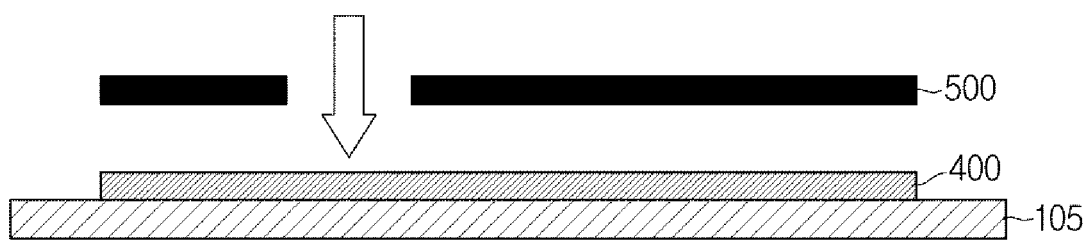
Figure 9:
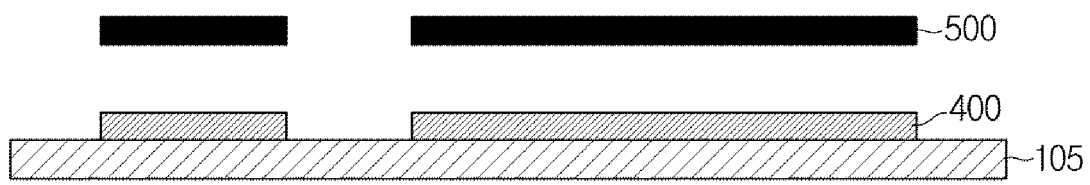

According to the example method, the photoresist 400 is exposed to light by using an exposure unit as illustrated in FIG. 8 and etched as illustrated in FIG. 9.

Figure 11:
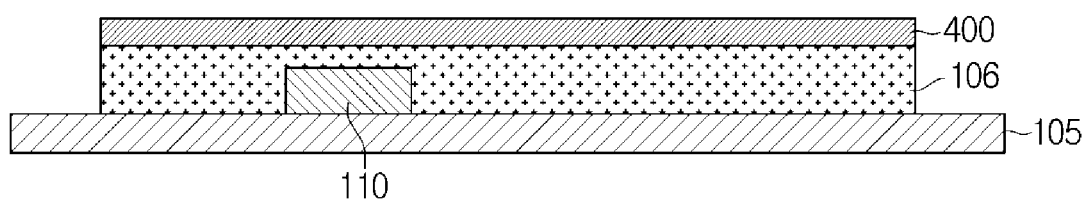

After etching, the first pad 110 is deposited thereon and an insulating material is coated thereon to form an insulating layer 106 as illustrated in FIG. 11 (320).

Figure 10:
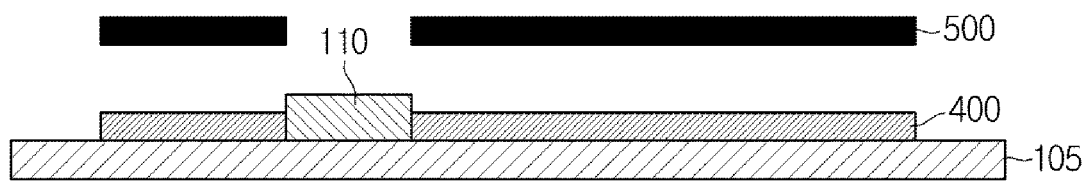

Specifically, the first pad 110 is formed on an etched region by deposition as illustrated in FIG. 10. Then, the insulating layer 106 is formed over the entire surface and the photoresist 400 is coated on the insulating layer 106 as illustrated in FIG. 11 to form a second pad 130. The insulating layer may be formed of silicon dioxide ($SiO_2$).

According to the example method, the photoresist 400 is etched at a position where the second pad 130 will be formed (330).

Figure 12:
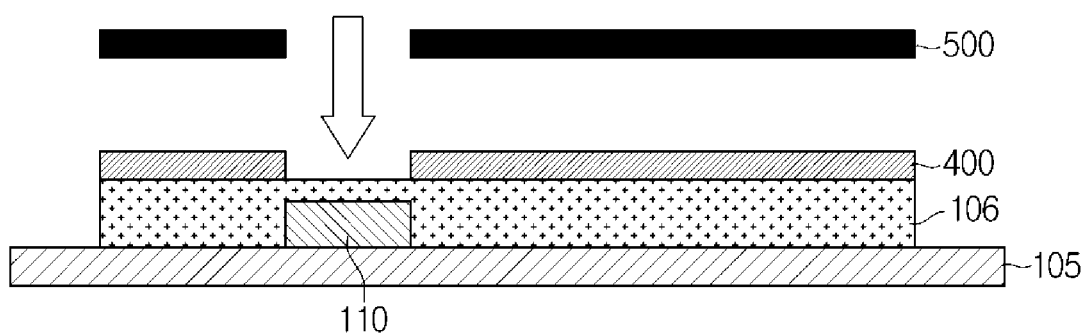
Figure 13:
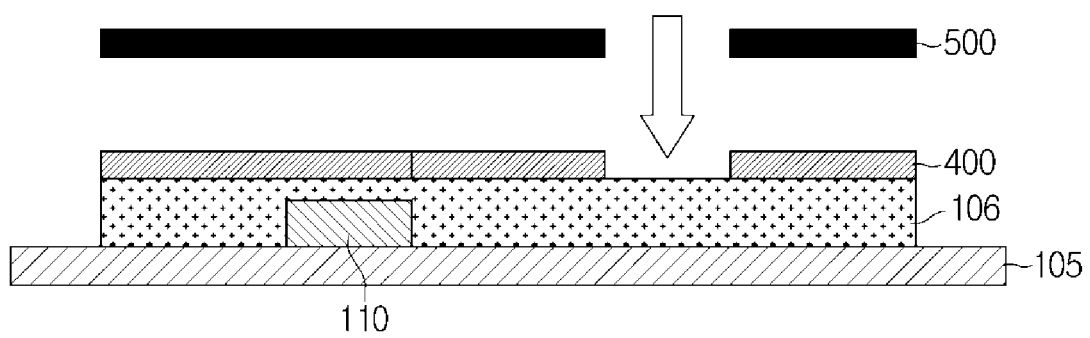

Specifically, according to the example fabrication method, the photoresist 400 and insulating layer 106 formed in the region of the first pad 110 is removed by light exposure before etching as illustrated in FIG. 12. Next, the photoresist 400 is etched at the position where the second pad 130 will be formed by using a mask 500 as illustrated in FIG. 13.

According to the fabrication method, the second pad 130 is deposited and the photoresist 400 is coated thereon again (340).

Figure 14:
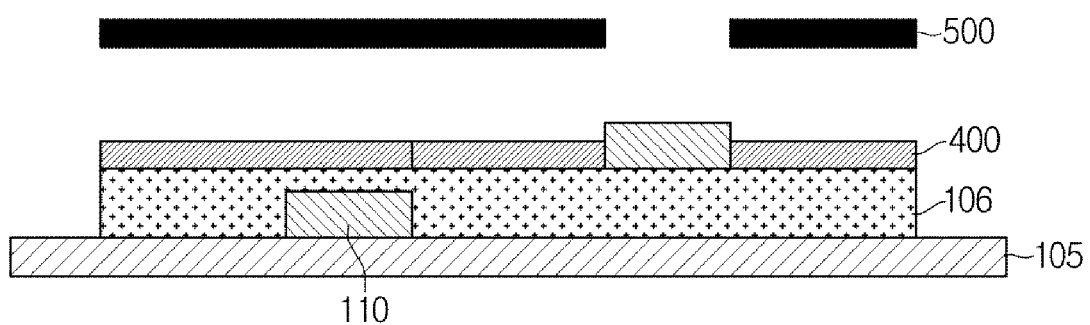
Figure 15:
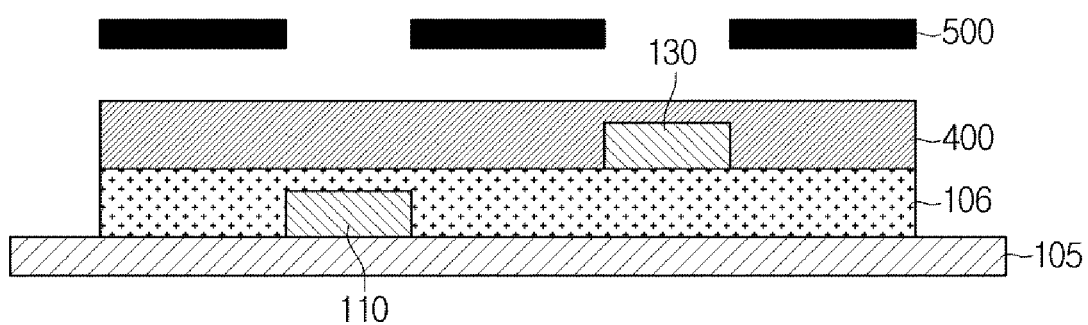

Specifically, the second pad 130 is deposited as illustrated in FIG. 14. Next, the photoresist 400 is coated thereon as illustrated in FIG. 15 to match flatness of each pad.

Figure 16:
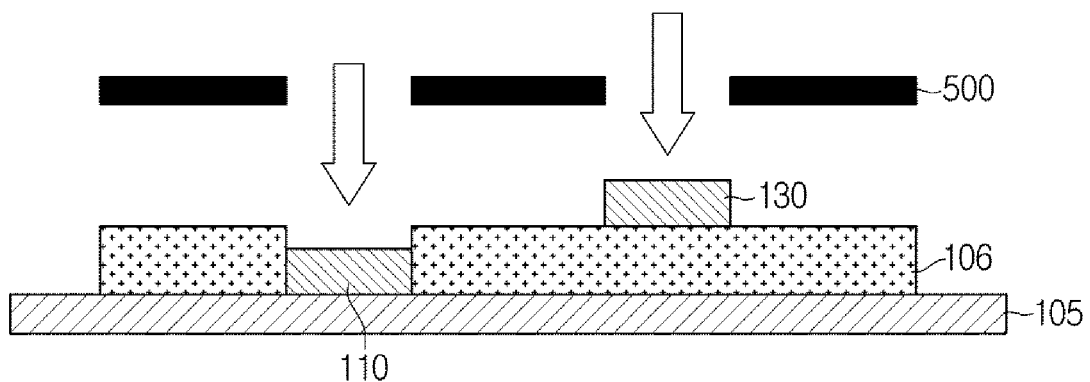

According to the example fabrication method, the regions corresponding to the first pad 110 and the second pad 130 are etched as illustrated in FIG. 16 (350).

Figure 17:
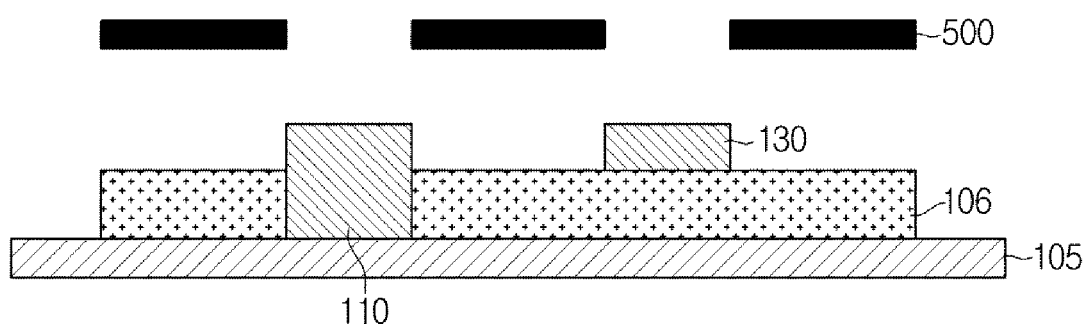

Next, the first pad 110 is re-deposited on the position of the first pad 110 as illustrated in FIG. 17 (360).

Figure 18:
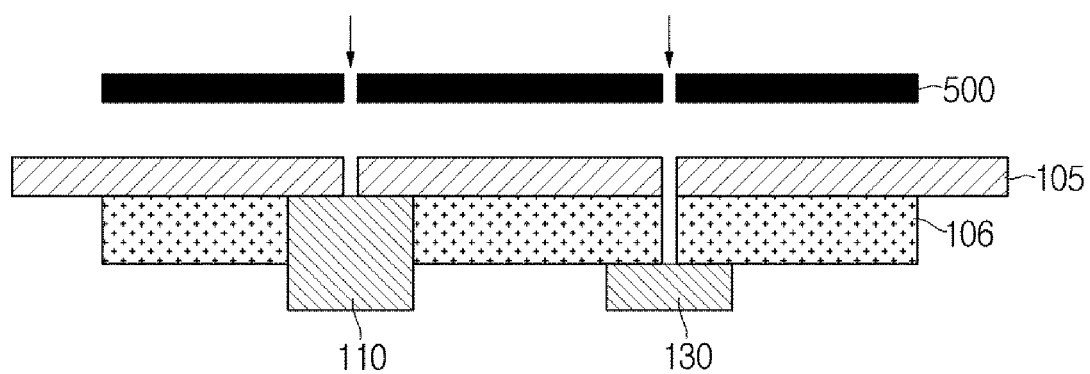

According to the fabrication method, a TSV process for connection of rear surface wiring is performed by using the mask 500 as illustrated in FIG. 18 (370).

Figure 19:
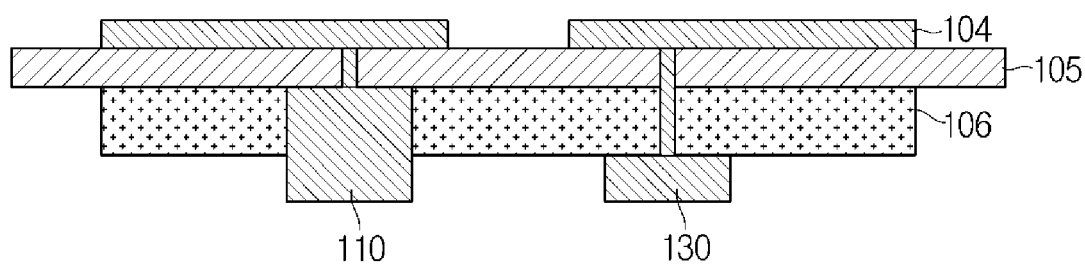

In the wafer probe card 100, a rear pad 104 is formed on the top surface of the silicon substrate 105 as illustrated in FIG. 19 via the TSV process.

The wafer probe card 100 is bonded to an anisotropic conductive film (ACF) 160 and a polyimide (PI) film 170 as illustrated in FIG. 20 (380).

Here, the ACF 160 is an anisotropic conductive film conducting electricity only in one direction and formed by mixing fine conductive particles with an adhesive resin, such as thermosetting resin, in a film state. The fine conductive particles included in the ACF 160 may be gold or silver.

In addition, the PI film 170 that withstands a high temperature of 400° C. or higher and a low temperature of −269° C. or lower is connected to the optical source application unit 30.

Meanwhile, the TSV 150 is formed between the rear pads 104 and the ACF 160 and the TSV 150 is connected to each of the first and second pads 110 and 130 such that electric wires are connected to form electrodes of the wafer probe card 100 as illustrated in FIGS. 4A and 4B.

When the wafer probe card 100 is fabricated as described above, a conventional process of using a probe may be omitted, an inspection time may be reduced by matching the wafer probe card 100 and the LED wafer in a one-to-one correspondence manner, and process complexity may be reduced by simplifying wiring required for light emission of the LEDs.

The above-described fabrication method is merely an example of fabricating the wafer probe card 100 and various modified methods may also be used therefor.

As is apparent from the above description, according to the wafer probe card, the analysis apparatus including the same, and the method of fabricating the wafer probe card, the wafer probe card may match in one-to-one correspondence with the LED wafer by implementing a probe system having the same size as the LED wafer and inspect brightness and wavelength of a plurality of LEDs at once by controlling the plurality of LEDs to emit light.

Although example embodiments of the present disclosure have been shown and described, it would be appreciated by those skilled in the art that changes may be made in these example embodiments without departing from the principles and spirit of the disclosure, the scope of which is defined in the claims and their equivalents.

What is claimed is:

1. A wafer probe card comprising:
a substrate;
an insulating layer formed on the substrate;
a plurality of first pads and a plurality of second pads formed on the insulating layer; and
a plurality of rear pads connected to the plurality of first pads and the plurality of second pads, respectively, via through silicon vias (TSVs),
wherein the plurality of first pads and the plurality of second pads are configured to transfer electrical signals to electrode pads of a light emitting diode (LED) wafer,
wherein the plurality of first pads are connected to each other by an electric wiring in a first direction through the TSVs, and
wherein the plurality of second pads are connected to each other by an electric wiring in a second direction through the TSVs.

2. The wafer probe card of claim 1, wherein the substrate is formed of silicon.

3. The wafer probe card of claim 1, wherein the wafer probe card comprises holes for alignment with the LED wafer.

4. The wafer probe card of claim 1, wherein the plurality of first pads are formed by deposition after etching the insulating layer.

5. The wafer probe card of claim 1, wherein an anisotropic conductive film (ACF) and a polyimide (PI) film are formed on the plurality of rear pads.

6. An analysis apparatus comprising:
an optical source application unit configured to transmit power to a wafer probe card;
an optical measurement unit configured to collect light emitted from a plurality of light emitting diodes (LEDs) and transmit measurement results of the light collected; and
a processor configured to execute instructions to control the optical source application unit and analyze the plurality of LEDs based on the measurement results received from the optical measurement unit,
wherein the wafer probe card comprises:
a substrate;
an insulating layer formed on the substrate;
a plurality of first pads and a plurality of second pads formed on the insulating layer; and
a plurality of rear pads connected to each of the plurality of first pads and the plurality of second pads, respectively, using through silicon vias (TSVs),
wherein the plurality of first pads and the plurality of second pads are configured to transfer power from the optical source application unit to the plurality of LEDs.

7. The analysis apparatus of claim 6, wherein the processor is further configured to control the optical source application unit to alternately apply the power.

8. The analysis apparatus of claim 6, wherein in the wafer probe card,
the plurality of first pads are connected to each other by an electric wiring in a first direction through the TSVs, and
the plurality of second pads are connected to each other by an electric wiring in a second direction through the TSVs.

9. The analysis apparatus of claim 8, wherein the processor is further configured to selectively apply power through the electric wiring in the first direction and the electric wiring in the second direction.

10. The analysis apparatus of claim 6, wherein the processor is further configured to create map data on the plurality of LEDs based on the measurement results.

11. The analysis apparatus of claim 10, further comprising a storage unit configured to store the created map data.

12. The analysis apparatus of claim 6, further comprising a stage on which a wafer comprising the plurality of LEDs is placed,
wherein the stage comprises a glass window configured to transmit the light emitted from the plurality of LEDs.

13. The analysis apparatus of claim 12, wherein the optical measurement unit is further configured to collect light transmitted through the glass window.

* * * * *